United States Patent [19]

Corbin, II et al.

[11] Patent Number: 5,097,422
[45] Date of Patent: Mar. 17, 1992

[54] METHOD AND APPARATUS FOR DESIGNING INTEGRATED CIRCUITS

[75] Inventors: Ludlow V. Corbin, II; Steven G. Danielson, both of Seattle; Richard E. Oettel, Bellevue; Mark E. Rossman, Redmond; James E. Thiele, Seattle, all of Wash.

[73] Assignee: Cascade Design Automation Corporation, Bellevue, Wash.

[21] Appl. No.: 374,485

[22] Filed: Jun. 29, 1989

Related U.S. Application Data

[63] Continuation of Ser. No. 917,917, Oct. 10, 1986, abandoned.

[51] Int. Cl.⁵ ............................................. G06F 15/60
[52] U.S. Cl. ................................. 364/491; 364/490; 364/489; 364/488
[58] Field of Search ............... 364/488, 489, 490, 491, 364/200

[56] References Cited

U.S. PATENT DOCUMENTS

| | | |
|---|---|---|
| H 354 | 10/1987 | Rubin ............................. 364/491 |
| 4,500,963 | 2/1985 | Smith et al. ..................... 364/488 |
| 4,554,625 | 11/1985 | Otten ............................... 364/491 |
| 4,577,276 | 3/1986 | Dunlop et al. .................. 364/491 |
| 4,580,228 | 4/1986 | Note ................................ 364/300 |
| 4,584,653 | 4/1986 | Chih et al. ...................... 364/491 |
| 4,630,219 | 12/1986 | DiGiacomo et al. ............ 364/488 |
| 4,635,208 | 1/1987 | Coleby et al. ................... 364/491 |
| 4,656,603 | 4/1987 | Dunn ............................... 364/488 |
| 4,667,290 | 5/1987 | Goss et al. ....................... 364/300 |
| 4,700,317 | 10/1987 | Watanabe et al. ............... 364/488 |

*Primary Examiner*—Parshotam S. Lall
*Assistant Examiner*—V. N. Trans
*Attorney, Agent, or Firm*—Seed and Berry

[57] ABSTRACT

A method and apparatus for determining integrated circuit layouts from a virtual circuit description and specification of a technology. Starting with high-level descriptions of a circuit, a virtual geometric description of the circuit is developed using a virtual grid described in terms of reference points relative to a substrate surface. The relationships among the reference points are expressed as fractions of variables that can also be used to define the design rules. When the technology is specified, the relationships among the reference points is determined, as in the layout of the integrated circuit.

16 Claims, 9 Drawing Sheets

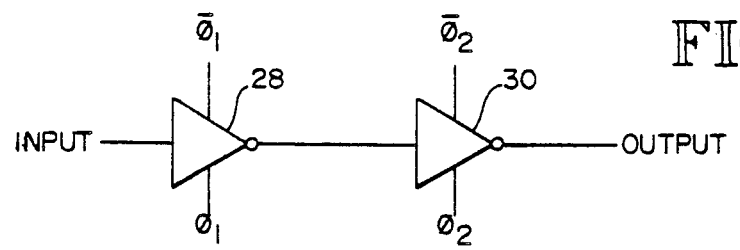
FIG. 3
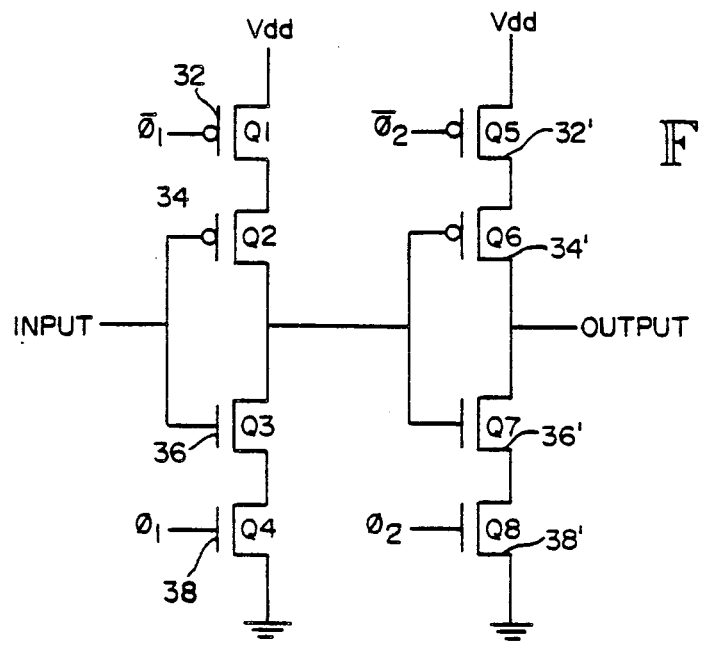
FIG. 4
FIG. 6

METHOD AND APPARATUS FOR DESIGNING INTEGRATED CIRCUITS

CROSS-REFERENCE TO RELATED APPLICATION

This application is a continuation of U.S. application Ser. No. 06/917,917 filed Oct. 10, 1986, now abandonned.

TECHNICAL FIELD

This invention relates to integrated circuit design tools. More particularly, this invention relates to a symbolic and dynamic method for designing integrated circuits and an apparatus for implementing such method.

BACKGROUND ART

A monolithic integrated circuit is a combination of interconnected circuit elements inseparably associated on or within a continuous substrate. Typically, the circuit elements are conventional components—transistors, diodes, capacitors, and resistors—fabricated in situ within or on a single crystal of semiconductor material with the capability of performing a complete electronic circuit function.

In practice, an integrated circuit is designed in a top-down method by first designing a logic level drawing and a transistor level drawing. These drawings then are used to design the more detailed integrated circuit layout, which shows the IC layers (i.e., metal, polysilicon, active, and the ways they interrelate to form transistor gates, wires, contact points, etc.). The integrated circuit layout, often referred to as "geometry," is used to generate the integrated circuit tooling, which is a series of masks, each representing a layer for the integrated circuit. The tooling is then used by manufacturers to fabricate an integrated circuit.

Typically, monolithic integrated circuits are fabricated by a process of photolithography, doping, and material deposition. Photolithography is any technique whereby light or other electromagnetic rays are shown through a mask to create a pattern on a silicon wafer coated with a photosensitive film. Doping includes those techniques for treating the exposed areas in the pattern to take on n- or p-type characteristics to form components of transistors and diodes. "Material deposition" refers to the growth or deposit of photoresist, insulating oxide, metal, polysilicon, and other materials that form the topology of the circuit.

In one method for fabricating an integrated circuit, a layer of photoresistive material is deposited on a semiconductor wafer. A mask for the integrated circuit is then placed over the layer of photoresistive material and light is shown through the mask to activate parts of the photoresistive material, thereby leaving a predetermined pattern of conductors on the wafer and exposed areas of the wafer between the conductors. Transistors and diodes are then formed by doping portions the exposed areas of the wafer with a chemical doping agent. A second mask can then be used to generate another pattern of conductors and exposed areas which are, once again, doped. Additional doping layers may also be used. After each doping step, the photoresistive material is chemically removed from the wafer. When the final doping layer has been completed, a pattern of exposed areas of the wafer is once again formed by exposing a layer of photoresist on the wafer through a mask. A layer of metal or other suitable conductor is then deposited onto portions of the exposed areas of the semiconductor wafer to form the desired interconnections between components on the wafer. Though there are many fabrication technologies, fabrication techniques, and integrated circuit materials, fabricating the design for the integrated circuit through one or more masks is used consistently.

Depending on the fabrication technologies and techniques, and the materials used, different configuration constraints apply. These constraints are commonly referred to as "geometric design rules" or "design rules." Design rules include, for example, specifications for minimum spacing between transistors and minimum separation between conductors to prevent shorting, specifications for minimum metal width, and specifications for maximum metal heights and slopes of walls which form metal junctions.

With the continued improvement of fabrication technologies and techniques and the development of new materials used in defining electronic circuits, design rules are changing to allow for smaller and smaller spacings between materials on an integrated circuit and to allow smaller and smaller substrate areas. Thus design rules may change during the development process of any particular circuits. Because increases in the die size of a mask by 15% typically result in a doubling of the cost of an integrated circuit, minimal substrate areas are desired.

One of the most commonly used methods for changing integrated circuit layouts to account for these design rules or changes in these design rules is called the "manual compaction method." If the substrate area specification is reduced during the middle of the design process, the designer, using the manual compaction method, manually varies each of the spacings shown in the integrated circuit layout. Because the relative movement of any component impacts the spacing of all adjacent components, the adjacent components may also have to be moved. As a result, this manual process is very tedious and time-consuming. It consequently limits the circuit complexity that integrated circuits designed in this manner can achieve, and precludes the development of a market for most custom-integrated circuits.

Another method used to make changes in integrated circuit layouts is the virtual grid compaction method, developed at Bell Laboratories. In this method, a virtual grid of typical worst-case component spacing is defined and the circuit components are relatively positioned on the grid using an automatic post-processing algorithm. Each grid line is then sequentially moved closer to another grid line until a design rule is violated. A problem with this approach is that the design rule constraint must apply to the entire grid line, thereby impacting neighboring devices which may have allowed for less spacing and thus more compaction.

Typically, the manual compaction processes have been the expensive and time-consuming processes used for minimizing the area and cost of an integrated circuit. A turnaround time of six months or more has been common. There has long been a need for a versatile and simple compaction method that can accommodate the various design rules and constraints from different fabrication techniques and materials and achieve compaction results comparable to manual methods.

DISCLOSURE OF THE INVENTION

An object of this invention is to provide a method and an apparatus for designing integrated circuits which are independent of the design rule constraints of conventional materials and fabrication technologies and techniques.

Another object of this invention is to provide a method and an apparatus for designing integrated circuits which minimize the area of a circuit layout for any given electronic circuit design, including highly complex, custom-designed integrated circuits.

A further object of this invention is to provide a method and an apparatus for designing integrated circuits that automate the design process so that highly complex, custom-integrated circuits can be economically produced in a relatively short time.

A still further object of this invention is to provide a method and an apparatus for designing integrated circuits which can be used to create electronic circuit design "building blocks," which in turn can be used for designing highly complex integrated circuits.

Yet another object of this invention is to provide a method and an apparatus for designing integrated circuits which require minimal integrated circuit design expertise in operation.

These and other objects of the invention are accomplished by a method for designing layouts using a dynamic virtual grid and a set of design rule variables. The grid is defined in relative terms, such that an origin along an x axis and an origin along a y axis are used to define reference points from which all positions on the grid are defined. These reference points are relative positions defined in terms of the origin or other reference points along the same axis, and/or one or more design rule variables. Integrated circuit components (contacts, gates, wires, etc.), then, are defined as one or more polygons, in a specific layer, using the reference points and design rule variables. A specific layout is defined by specifying values for the design rule variables, thereby fixing the positions of the integrated circuit components. If the fabrication process for manufacturing the chip changes or the technology changes to allow for smaller dimensions, thereby changing the layout position constraints (a part of the design rules), the design rule variables are changed accordingly and a new geometry is defined. Designing integrated circuits in this manner thus achieves design rule independence.

Though the method described refers to relatively positioning integrated circuit components and to design rule variables corresponding to positioning constraints for various fabrication technologies and techniques, the method could also be used for relatively positioning other objects and for design rule variables corresponding to other positioning constraints.

Typically, the method is used for designing subportions of an integrated circuit which are then integrated to form an entire integrated circuit layout database. The database is used to form tooling and/or masks for conventional fabrication processes. The subportions may be strategically designed by function, so the geometry may be used as an interchangeable module for various integrated circuit layouts or as a building block in highly complex integrated circuits. Thus, the method is commonly referred to as "module compilation."

One apparatus for implementing this invention is a computer system used to host software tools for designing integrated circuits. A subset of the software tools and the methodology for using such subset combine to be the preferred embodiment of the method of this invention. The computer system is used to automate the design process and might include additional software tools for integrating modules, simulating integrated circuit performance, printing geometries, and creating tooling (such as masks).

BRIEF DESCRIPTION OF THE DRAWINGS

FIG. 3 is a sample gate level schematic of one cell of a clocked dynamic shift register.

FIG. 4 is a sample discrete device level schematic of one cell of a clocked dynamic shift register.

FIG. 6 is a sample schematic symbol for an eight-bit clocked dynamic shift register.

BEST MODE FOR CARRYING OUT THE INVENTION

Hardware

Figure 1:
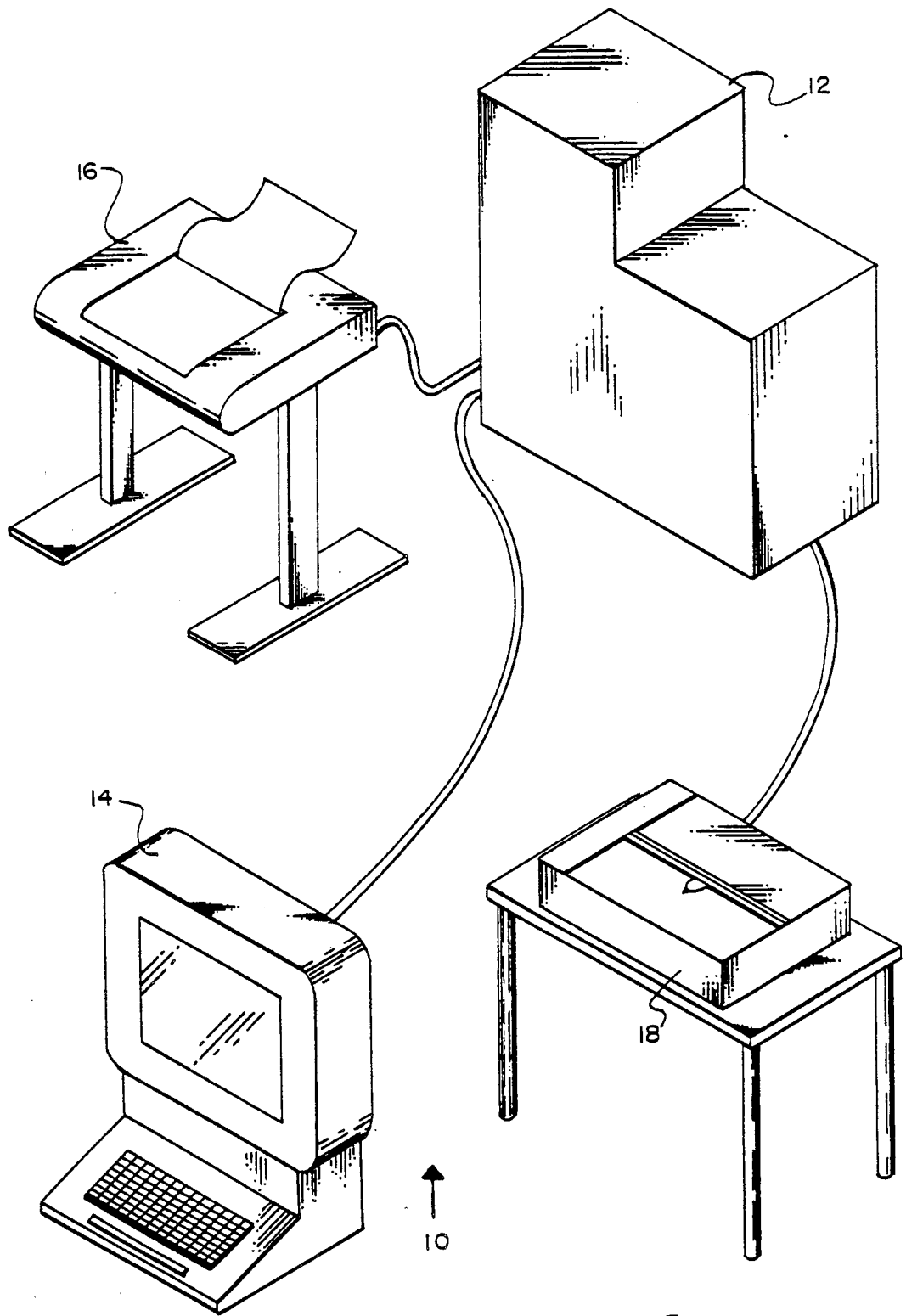
FIG. 1 is an isometric view of an embodiment of the apparatus for designing integrated circuits.

Referring to FIG. 1, the preferred embodiment of the apparatus for designing integrated circuits 10 is a conventional computer system including a computer 12, terminal 14, printer 16, and plotter 18. In one embodiment, the computer is a VAX 11/785, model no. 11-785-AA, manufactured by Digital Equipment Corporation (DEC); the terminal is an AED 767 monitor terminal manufactured by Advanced Electronic Design, Inc.; the printer may be any one of a large number of available models; and the plotter is an HP 7475A manufactured by Hewlett-Packard, Inc. The VAX 11/785 uses a UNIX version 4.2 operating system and includes an interface program for the AED 767 monitor called "Caesar version 7," developed at the University of California at Berkeley, and a "C" program language compiler, developed by Bell Laboratories. In the preferred embodiment, the method for designing integrated circuits is embodied within a Compiler Development System (CDS).

Software

The computer system 10 includes a set of software tools for designing integrated circuit module compilers, each consisting of source code and executable code. The integrated circuit module is an array of cells. Each cell, in turn, is the geometric definition of the required integrated circuit components. Every module can be combined, like a building block, with other modules in order to create a complete geometric description of an integrated circuit and a corresponding mask work.

The preferred embodiment of the method is, in effect, the implementation of a high level software language referred to as the "Silicon Compiler Software Language for Integrated Circuits" (SLIC). Each SLIC command comprises, in one embodiment, a set of "C" language function calls. Thus, the preferred embodiment is a language for writing source code which is to be compiled to generate executable code. Execution of the executable code results in a specific geometry layout.

The module compiler, developed using CDS, may be used with other module compilers or alone to develop an integrated circuit layout. Typically, the software tools for developing module compilers are used with other software in packages such as the Concorde ™ VLSI Compiler produced by Seattle Silicon Technology, Inc. These other software tools include programs for interconnecting modules, such as the Pride/Auto Route ™ software tool within the Concorde ™ package.

Typically, a modular approach is used for designing a complex integrate circuit. In this approach, the circuit for each module is designed, tested, and debugged before it is integrated with other modules to form the complete integrated circuit layout and mask work.

Although the preferred embodiment of the method is a software embodiment designed to run on the VAX 11/785 having a Unix Version 4.2 operating system and a "C" compiler, other embodiments of the method could be software programs designed to run on computer systems using other computers, terminals, printers, and plotters with another operating system and programming language. Still other embodiments of the method need not take the form of a computer program or be implemented through a computer system.

SLIC is an extension language of the "C" programming language. SLIC is used to write geometry generator source code for generating a layout. A second extension language, GSSLIC, may be used to write simulation model source code for simulating the performance of the layout design. A third extension language, SSSLIC, may be used to write schematic symbol generator source code for deriving a schematic symbol for the module under development (e.g., the logic symbol for an 'OR' gate with inputs and outputs).

METHODOLGY: MANUAL DRAWINGS

Figure 2:
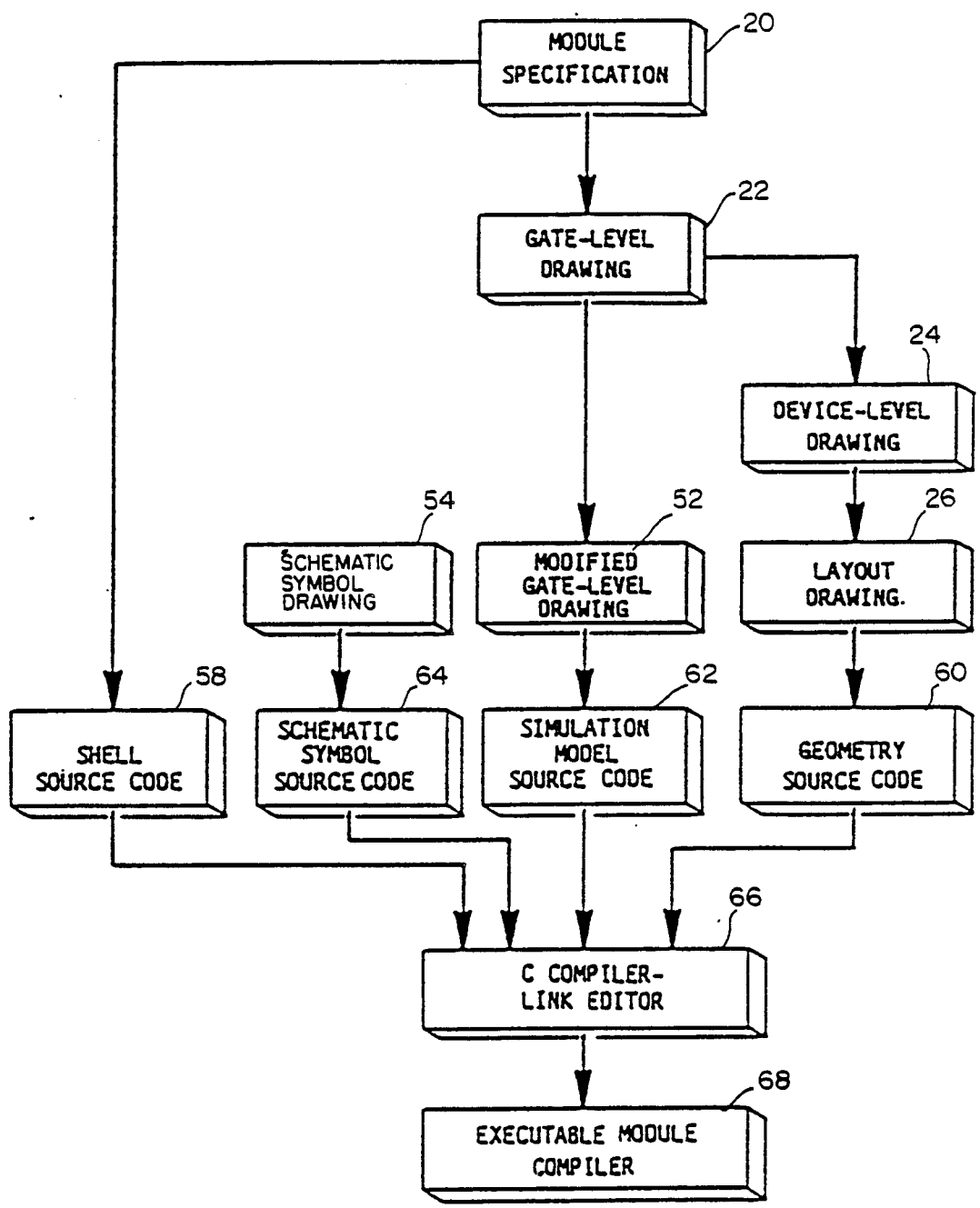
FIG. 2 is a flow chart for designing an integrated circuit module compiler using the apparatus of FIG. 1.

Referring to FIG. 2, the following is a description of the methodology used to design integrated circuit module compilers. As a preliminary step, the designer identifies the module specification 20, including the technology to be used (e.g., CMOS or BIPOLAR), the functional characteristics of the circuit, a connection diagram, the approximate dimensions, and the end user input options for the integrated circuit module. The designer then develops preliminary high-level drawings of the integrated circuit. One drawing, typically, is a gate level drawing 22 specifying the circuits with standard gates and interconnections. At the next level, the gates are reduced to their discrete devices (i.e., transistors) in a device level drawing 24. From the device level drawing, a preliminary layout drawing 26 is then derived, translating the discrete devices into a physical geometry of layers and components, such as wires, contacts, etc.

As an example, a clocked dynamic shift register might be specified as follows:

The design will be implemented in CMOS PWELL technology, with Vdd above, +5 volts, GND below, 0.5 volts. The input will be placed on the left, the output on the right. Each cell (or bit) of the shift register will delay an input signal one clock cycle. The number of bits, and thus the number of delays, is determined by the designer. There is to be no limit to the number of bits allowed.

Referring to FIG. 3, the gate level schematic (drawing 22 in FIG. 2) for one cell of the serial-in, serial-out clocked dynamic shift register specified above consists of two clocked inverters 28, 30, which together have the effect of delaying an input signal one clock cycle. Referring to FIG. 4, a single cell at the discrete device level (drawing 24 in FIG. 2) for the serial-in, serial-out clocked dynamic shift register specified above comprises two identical buffers, each consisting of a basic inverter circuit of transistors 32, 34, 36, 38 and 32', 34', 36', 38'.

Figure 5:
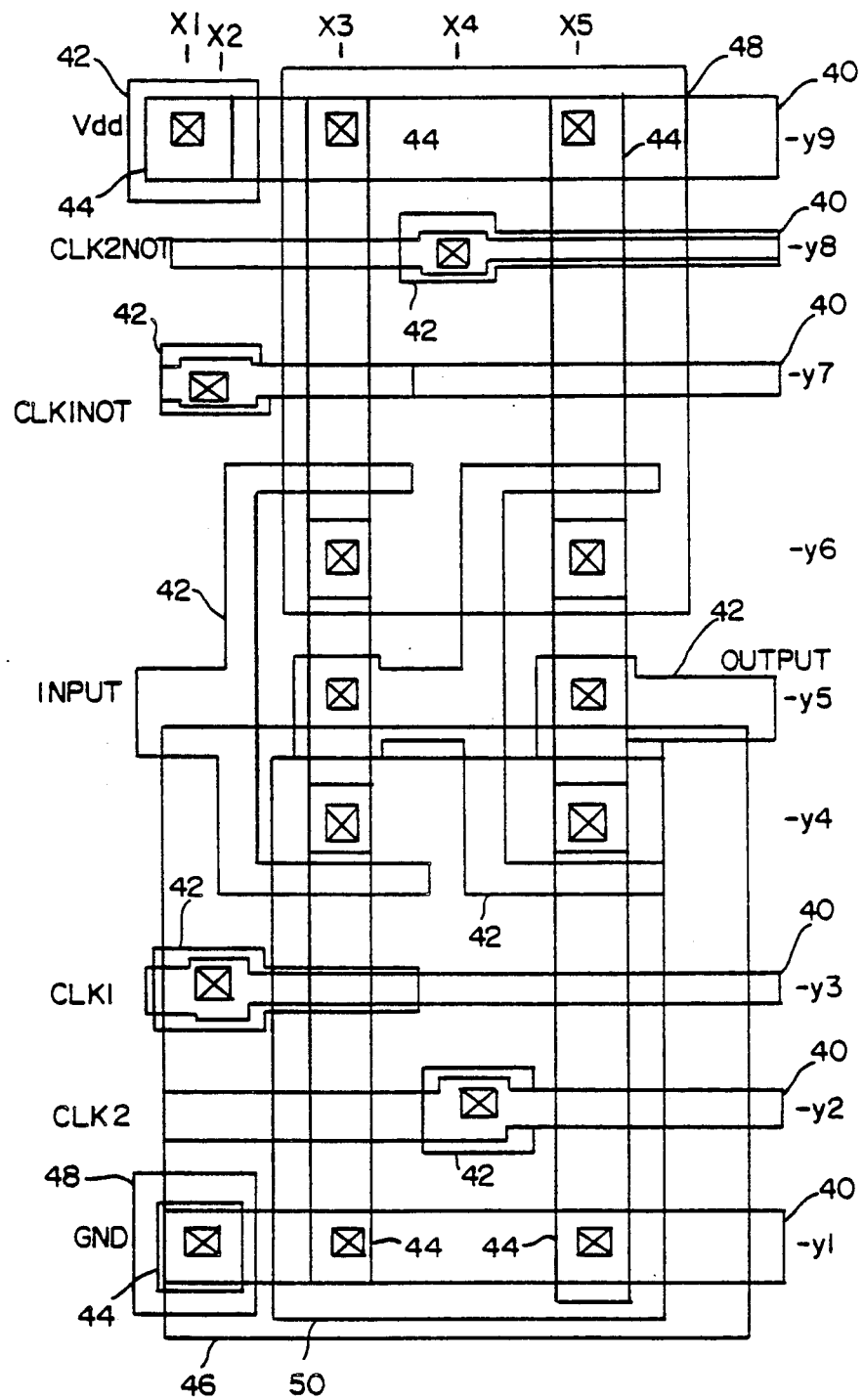
FIG. 5 is a sample hand-drawn geometry layout of a clocked dynamic shift register.

Referring to FIG. 5, the preliminary, manually drawn layout (drawing 26 in FIG. 2) for one cell of the serial-in, serial-out clocked dynamic shift register is shown, comprising its component metal 40, polysilicon 42, and active (diffusion) region 44, PWELL 46, P+ region 48, and N+ regions 50. The input, output, clock signals (CLK1, CLK2), inverted clock signals (CLK1NOT, CLK2NOT), power voltage (Vdd), and ground connections (GND) are all labeled.

The designer strategically identifies reference points (X1-X5, Y1-Y9) for forming a dynamic virtual grid. Each reference point is defined along an X axis or a Y axis. In this case, the reference points are defined as all horizontal rows and vertical columns that contain at least one contact (specified by an "X" in FIG. 5). These reference points can be defined with respect to other landmarks, such as transistor gates, the center of a wire, or other geometric features.

The positions of these reference points will be defined using SLIC source code as mathematical functions of an origin, another reference point, and/or one or more design rule variables, electrical rule variables, or other constraints. The relationships among the reference points can be referred to as virtual geometric relationships. Design rule variables are variables specifying configuration constraints, such as metal width, polysilicon width, metal spacing, etc. A sample of design rule variables, by no means a complete list, is included below in Table 1.

By defining the reference points in this manner, the virtual grid may be abstracted from the reference points to consist of lines crossing each other, wherein the spacing between lines is not determined. The grid is not part of the layout, but instead is a virtual grid for dynamically defining relative integrated circuit feature positions. The virtual grid is superimposed on a fixed grid of centi- micron units, using the X origin and Y origin as the link between the two grids. The fixed grid defines the precision designed into the geometry generator for relatively positioning components on the virtual grid.

After designing the preliminary layout and labeling the reference points, the designer may wish to design a modified gate level drawing 52 (see FIG. 2) as a result of the discovery of advantageous gate level changes that can be made. For example, an alternative way of realizing a given logic function could be discovered at this point. As a preliminary step, the designer also defines a schematic symbol drawing 54 to be used to represent the module in an overall schematic diagram of an integrated circuit using the shift register. Referring to FIG. 6, a schematic symbol 56 for an eight-bit clocked dynamic shift register is shown.

TABLE 1

Design Rule Variables
Below is a sample list of design rule variables defining minimum value constraints between material edges for a typical CMOS process.

| Name | Description |
|---|---|
| aw | Active area width |
| as | Active area spacing (N+ Active to N+ Active or P+ Active to P+ Active) |
| napasi | N+ active area to P+ active area (in PWELL, different potentials) |
| pww | Minimum PWELL width |
| pwona | PWELL overlap of N+ active inside PWELL |
| pyw | Poly width |
| pys | Poly spacing |
| cw | Cut width |
| cs | Cut spacing |
| aoc | Active overlap of contact |
| moc | Metal overlap of contact |
| mw | Metal width |
| ms | Metal spacing |
| ppw | P+ mask width |
| nnw | N+ mask width |
| pds | Pad-to-pad spacing (glass-to-glass) |
| saw | Scribe line active width |
| scw | Scribe line cut width |
| pwss | PWELL spacing, same potential |
| pac2sbc | Center of p+ active contact to center of substrate contact |
| a2pycm | Center of active wire to center of poly contact in the direction of metal |
| ac2pycm | Center of active contact to center of poly-metal contact in the direction of metal |
| hac | Half active contact width |
| dac | Delta value by which the center of a minimum width active wire must diverge from the center of a contact-width active wire to achieve a common edge |
| py2py | Poly wire center to poly wire center (minimum width assumed) |
| py2pyc | Poly wire center (minimum width assumed) to center of poly contact, poly contact not in direction of metal |
| mc2mc | Metal wire center to metal wire center, widest possible contacts assumed |
| bm2bm | Spacing between centers of big metal wires |
| dpyc | Delta value by which the center of a minimum width poly wire must diverge from the center of a contact-width poly wire to achieve a common edge |
| ac2gt | Center of active contact to center of gate region |
| nac2pac | Center of n+ active contact to center of p+ active contact |
| bm | Big metal width |
| mw | Minimum metal width |
| gtx2 | Center of gate region to poly extension beyond gate minus ½ poly width |
| pyoc | Poly overlap of contact not in direction of metal |
| pyw | Minimum poly width |
| pwopac | Pwell overlap of p+ active cut |
| pwonac | Pwell overlap of n+ active cut |
| noac | N+ mask overlap of active cut |

METHODOLOGY: MODULE COMPILER

Using the design rule variables in Table 1, the designer can write a computer program using the well-known "C" programming language and SLIC commands to generate a design rule-independent layout rule module compiler. Using the module specification 20 (in FIG. 2), the designer may write shell source code 58 in the "C" programming language to define the module, may include a file of design rules, and may also develop an interactive menu to make the completed module compiler "user-friendly."

Using the layout drawing 26 (in FIGS. 2 and 5) for reference, the designer includes SLIC commands as geometry generator source code 60. This source code defines the dynamic virtual grid in terms of the reference points shown in FIG. 5. Referring to Table 2, below, an example of SLIC source code used to define the reference points for one cell of the clocked dynamic shift register specified above is shown in program lines 81-85 and 88-96. This example also includes shell source code 58.

TABLE 2

```
1   /************************************************
2   *
3   * Module: Dynamic Shift Reg. Shell & Geometry Generator
4   *
5   ************************************************/
6
7
8
9   /************************************************
10                    COMPILER SHELL
11  ************************************************/
12
13
14
15  #include <stdio.h>
16  #include "/u9/exp/include/slic.h"
17
18
19  main(argc, argv)
20  INT32 argc;
21  char *argv[];
```

```
22   {
23   INT32 nbits;
24   char modname[80];
25
26
27   printf ("\nDYNAMIC SHIFT REGISTER MODULE COMPILER\n");
28   printf ("\nModule Name? ");
29   scanf  ("%s", modname);
30   printf ("\nNumber of Bits? ");
31   scanf  ("%d", &nbits);
32   printf ("\nCreating Module %s...\n\n",modname);
33
34   cfInit();
35   initialize(argc, argv);
36
37
38   dsrlyout(nbits,modname);
39   }
40
41
42
43   /*********************************************************
44                     GEOMETRY GENERATOR
45   *********************************************************/
46
47
48
49   dsrlyout(nbits,modname)
50   INT32 nbits;
51   char *modname;
52
53
55   {
56   INT32 x1,x2,x3,x4,x5,xd1;
57   INT32 y1,y2,y3,y4,y5,y6,y7,y8,y9,yd1;
58   INT32 xorigin,yorigin;
59   INT32 rtend;
60   INT32 j;
61   UPORTRECORD pp;
62   char last[80], now[80];
63   char temp[80],inst[80];
64   char command[80];
65
66   xorigin=0; yorigin=0;
67
68
69   /*********************************************************
70                     Define the Subcell
71   *********************************************************/
72
73
74
75   define("SRsubcell");
76
77
78   rtend=MAX(nac2pwc,pac2sbc);
79
80
81   landmark("x1",x1,xorigin);
82   landmark("x3",x3,x1+rtend);
```

```
 83    landmark("x2",x2,x3-a2pycm-hac);
 84    landmark("x5",x5,MAX(x3+dac*2+a2pycm*2,x3+gtx2+py+py2pyc));
 85    landmark("x4",x4,x5-a2pycm-dac);
 86
 87
 88    landmark("y1",y1,yorigin):
 89    landmark("y2",y2,y1+mc2mc);
 90    landmark("y3",y3,y2+mc2md);
 91    landmark("y4",y4,y3+MAX(bm2bm,py2py+ac2gt));
 92    landmark("y5",y5,y4+ac2pycm);
 93    landmark("y6",y6,MAX(y5+ac2pycm,y4+nac2pac));
 94    landmark("y7",y7,y6+MAX(bm2bm,py2py+ac2gt));
 95    landmark("y8",y8,y7+mc2mc);
 96    landmark("y9",y9,y8+mc2md);
 97
 98
 99
100
101    /****************** METAL LAYER  ****************/
102
103
104    layer("metal");
105
106
107    /*************** Power and Ground  ***************/
108
109
110    wire(bm,x1,y1);x(x5+rtend);
111    wire(bm,x1,y9);x(x5+rtend);
112
113
114    /****************** Clock Lines  ****************/
115
116
117    wire(mw,x1+mw/2-bm/2,y2);x(x5+rtend-mw/2+bm/2);
118    wire(mw,x1+mw/2-bm/2,y3);x(x5+rtend-mw/2+bm/2);
119    wire(mw,x1+mw/2-bm/2,y7);x(x5+rtend-mw/2+bm/2);
120    wire(mw,x1+mw/2-bm/2,y8);x(x5+rtend-mw/2+bm/2);
121
122
123    /************ Transistor Connections  ************/
124
125
126    wire(bm,x3,y4);y(y6);
127    wire(bm,x3,y4);y(y6);
128
129
130    /***************** ACTIVE LAYER  *****************/
131
132
133    layer("active");
134
135    wire(2*hac,x3,y1);y(y4);
136    wire(2*hac,x3,y6);y(y9);
137    wire(2*hac,x5,y1);y(y4);
138    wire(2*hac,x5,y6);y(y9);
139
140
141    /****************** POLY LAYER  *****************/
142
```

```
143
144  layer("poly");
145
146
147  /*************** C-shaped Gates ****************/
148
149
150
151  wire(pyw,x3+gtx2,y4-ac2gt);x(x3-py2pyc); y(y6+ac2gt);
     x(x3+gtx2);
152  wire(pyw,x5+gtx2,y4-ac2gt);x(x5-py2pyc); y(y6+ac2gt);
     x(x5+gtx2);
153
154
155
156  /**************** Clock Gates ****************/
157
158
159
160  wire(pyw,x3+gtx2,y3);x(x2);
161  wire(pyw,x5+gtx2,y2);x(x4);
162  wire(pyw,x3+gtx2,y7);x(x2);
163  wire(pyw,x5+gtx2,y8);x(x4);
164
165
166  /********** Stage to Stage Interconnects **********/
167
168
169  wire(cw+pyoc*2,x3-py2pyc-cw/2-pyoc,y5);
     x(x3-py2pyc+pyw/2-cw/2-pyoc);
170  wire(cw+pyoc*2,x3,y5);x(x5-py2pyc+pyw/2-cw/2pyoc);
171  wire(cw+pyoc*2,x5,y5);x(x5+rtend-cw/2-pyoc+bm/2);
172
173
174  /******** ADD SUBSTRATE AND PWELL CONTACTS ********/
175
176
177  PWCON(x1,y1);
178  SUBCON(x1,y9);
179
180
181
182  /************ ADD ALL OTHER CONTACTS ************/
183
184
185
186  MA(x5,y1);
187  MA(x3,y4);
188  MA(x3,y6);
189  MA(x5,y6);
190  MA(x5,y4);
191  MA(x5,y9);
192  MA(x3,y1);
193  MA(x3,y9);
194
195
196  PYM(x2,y3,"EW");
197  PYM(x4,y2,"EW");
198  PYM(x2,y7,"EW");
199  PYM(x4,y8,"EW");
```

```
200  PYM(x3,y5,"NS");
201  PYM(x5,y5,"NS");
202
203
204
205
206  /*************** N+ ACTIVE LAYER ***************/
207
208
209  layer("nplus");
210
211  box(x1+poac,y1-noac,x5+noac,y4+poac);
212
213
214  /*************** P+ ACTIVE LAYER ***************/
215
216
217  layer("pplus");
218
219  box(x1+noac,y6-poac,x5+poac,y9+poac);
220
221
222  /*************** PWELL LAYER *******************/
223
224
225  layer("pwell");
226
227  box(x1-pwopac,y1-MAX(pwopac,pwonac),x5+mc2mc+bm/2,
     y4+pwonac);
228
229
230  /**************** ADD THE PORTS ***************/
231
231
233  port("GND_LR",x5+rtend,y1,"metal",NONE);
234  port("CLK_R",x5+rtend,y2,"metal",NONE);
235  port("CLK1_R",x5+rtend,y3,"metal",NONE);
236  port("OUTPUT",x5+rtend,y5,"poly",NONE);
237  port("CLK1NOT_R",x5+rtend,y7,"metal",NONE);
238  port("CLK2NOT_R",x5+rtend,y8,"metal",NONE);
239  port("Vdd_UR",x5+rtend,y9,"metal",NONE);
240  port("GND_ll",x1,y1,"metal",NONE);
241  port("CLK2_L",x1,y2,"metal",NONE);
242  port("CLK1_L",x1,y3,"metal",NONE);
243  port("INPUT",x1,y5,"poly",NONE);
244  port("CLK1NOT_L",x1,y7,"metal",NONE);
245  port("CLK2NOT_L",x1, 8,"metal",NONE);
246  port("Vdd_UR",x1,y9,"metal",NONE);
247  port("ST1OUT",x5-py2pyc,y5,"poly",NONE);
248
249
250  enddef();
251
252
253  /************************************************
254                  Define the Module
255  ************************************************/
256
257
258  define(modname);
```

```
259  xdl = 0;
260  ydl = 0;
261
262
263  /************* MAKE A ROW OF CELLS **************/
264
265
266  sprintf(last,"bit%d",0);
267  call("SRsubcell",NONE,xdl,ydl,last);
278
269  for (j=1;j<nbits;j++)
270  {
271
272  sprintf(now,"bit%d",j);
273  sprintf(last,"bit%d",j-1);
274  placeon("SRsubcell","GND_ll",NONE,now,last,"GND_LR",0,0);
275
276  }
277
278
279  /********** ADD THE PORT AND NODE LABELS **********
280
281
282  for (j=0;j<nbits;j++)
283  {
284  sprintf(inst,"bit%d",j);
285
286  sprintf(temp,"OUTPUT%d",j);
287  getp(inst,"OUTPUT",&pp, NO);
288  nodelabel(temp,pp.x,pp.y,"poly");
289
290  sprintf(temp,"ST1OUT%d",j);
291  getp(inst,"ST1OUT",&pp, NO);
292  nodelabel(temp,pp.x,pp.y,"poly");
293  }
294
295  j = 0;
296  sprintf(inst,"bit%d",j);
297
298  getp(inst,"GND_ll",&pp, NO);
299  tport("GND_ll",pp.x,pp.y,"metal",NONE,bm,0,
     "Wports.Sports");
300
301  getp(inst,"CLK2_L",&pp, NO);
302  nodelabel ("CLK2_L",pp.x,pp.y,"metal");
303  tport("CLK2_L",pp.x,pp.y,"metal",NONE,mw,0,"Wports");
304
305  getp(inst,"CLK1_L",&pp, NO);
306  nodelabel("CLK1_L",pp.x,pp.y,"metal");
307  tport("CLK1_L",pp.x,pp.y,"poly","metal",pyw,mw,"Wports");
308
309  getp(inst,"INPUT",&pp, NO);
310  nodelabel("INPUT",pp.x,pp.y,"poly");
311  tport("INPUT",pp.x,pp.y,"poly",NONE,cw+pyoc*2,0,"Wports");
312
313  getp(inst,"CLK1NOT_L",&pp, NO);
314  nodelabel("CLK1NOT_L",pp.x,pp.y,"metal");
315  tport("CLK1NOT_L",pp.x,pp.y,"poly","metal",pyw,mw,
     Wports");
316
```

```
317    getp(inst,"CLK2NOT_L",&pp, NO);
318    nodelabel("CLK2NOT_L",pp.x,pp.y,"metal");
319    tport("CLK2NOT_L",pp.x,pp.y,"metal",NONE,mw,0,"Wports");
320
321    getp(inst,"Vdd_UL",&pp, NO);
322    tport("Vdd_UL",pp.x,pp.y,"metal",NONE,mw,0,
       "Wports.Nports");
323
324
325    j = nbits-1;
326    sprintf(inst,"bit%d",j);
327
328    getp(inst,"GND_LR",&pp, NO);
329    tport("GND_LR",pp.x,pp.y,"metal",NONE,bm,0,
       "Eports.Sports");
330    getp(inst,"CLK_R",&pp, NO);
331    tport("CLK_R",pp.x,pp.y,"metal",NONE,mw,0,"Eports");
332
333    getp(inst,"CLK1_R",&pp, NO);
334    tport("CLK1_R",pp.x,pp.y,"metal",NONE,mw,0,"Eports");
335
336    getp(inst,"OUTPUT",&pp, NO);
337    tport("OUTPUT",pp.x,pp.y,"poly",NONE,cw+pyoc*2,0,"Eports");
338
339    getp(inst,"CLK1NOT_R",&pp, NO);
340    tport("CLK1NOT_R",pp.x,pp.y,"metal",NONE,mw,0,"Eports");
341
339    getp(inst,"CLK2NOT_R",&pp, NO);
340    tport("CLK2NOT_R",pp.x,pp.y,"metal",NONE,mw,0,"Eports");
```

In this example, reference points are defined using landmark commands. Note that landmark x1 is defined in terms of the origin, and landmark x3 is defined in terms of the x1 landmark and a variable, rtend, which is defined as "the greater of the two design rule variables 'nac2pwc' 'pac2sbc.'" "nac2pwc" means the center of an n+ active contact to the center of p+ active contact, and "pac2sbc" means the center of p+ active contact to the center of substrate contact.

The cell features are then defined layer by layer and feature by feature in terms of landmarks and design rule variables. Again referring to Table 2, the source code for the clocked dynamic shift register example specified above includes SLIC source code for defining a metal layer (lines 101-129), an active layer (lines 130-140), a polysilicon layer (lines 141-173), the substrate and PWELL contacts (lines 174-181), and all other contacts (lines 182-205), followed by the N+ active layer (lines 206-213), P+ active layer (lines 214-221), PWELL layer (lines 222-229), and the ports (lines 230-249). At lines 266-274, the module is defined to include a variable number of cells, "nbits."

As previously mentioned, the features of the integrated circuit are defined in terms of a specified layer, reference points, and design rule variables. For example, the power and ground lines, the clock lines, and the transistor connections for the clocked dynamic shift register example are each metal features. They are defined using the SLIC "wire" statement. The wire is defined using reference points and design rule variables to specify the width of the wire and the X and Y beginning point direction (right-left (X), up-down (Y), diagonal (XY)), and end point (x or y). Thus, in program line 110 of Table 2, wire (bm, x1, y1); x (x5+rtend), which defines a power line, means "draw a wire of big metal (bm) width from landmarks x1, y1 in a horizontal direction to x5 plus the value of rtend." "rtend" is a variable defined as "a function of two design rule variables 'nac2pwc' and 'pac2sbc.'"

LAYOUT DEFINITION COMMANDS

The following types of commands are part of the SLIC extension language used for defining layouts: grid commands, primitive geometry commands, contact commands, label commands, draw/place commands, location commands, attribute commands, bounding box commands, and miscellaneous commands. Many of these commands are shown in the listing of Table 2.

Grid commands define the reference points that form the virtual dynamic grid of the layout drawing (see lines 81-96 in Table 2), thereby describing their virtual geometric relationship. The position of a landmark is usually defined relative to a previously defined landmark other than the first landmark along each axis. The first point defined in an axis is usually an origin. This relative definition enables the user to establish a dependency among the landmarks. Thus, when a landmark is moved, subordinate landmarks will move with it, whereas independent landmarks will not.

Primitive geometry commands are used for placing a layer, a wire, a polygon, or a box on the virtual dynamic grid and are defined as functions of layer, reference points, and design rule variables. Examples are shown on lines 117-120 of Table 2. Geometry commands enable extension of a wire center, an edge in an X direction or a Y direction, or a diagonal direction by a given length.

Contact commands are used to place contact cells at specified coordinates (for example see lines 186–193 and 196–201). A contact is a juncture point for joining two layers to provide a conductive path for current flow. Examples are found in lines 186–201 of Table 2.

Label commands are used for defining ports, such as power ports, ground ports, input ports, output ports, etc. Illustrations of the label commands can be seen on lines 233–247 of the listing in Table 2. Additionally, there are node label commands for defining nodes used for simulation purposes.

Draw commands put instances of cells in specified reference point. Place commands place instances of cells at locations relative to previously placed instances.

Location commands retrieve the a location and size a port. Attribute commands assign attributes to a cell or elements within a cell, such as the location of a port on one side of a module.

Bounding box commands are used for defining a cell or module boundary or perimeter.

While the above has been a description of the SLIC extension language commands used to write geometry generator source code 60, a designer may go further and write simulation model generator source code 62 (see FIG. 2) using the GSSLIC extension language or schematic symbol generator source code 64 using the SSSLIC extension language. The designer would write these extra codes if there were a need to simulate or develop a schematic symbol for the circuit developed.

COMPILE AND LINK EDITOR

The geometry generator, simulation model generator, and schematic symbol generator source codes are compiled and linked (if the latter two codes have been written) using the computer system's "C" compiler and link editor 66 to produce a module compiler 68. The module compiler then generates a geometry database and possibly a simulation model and a schematic symbol databases. These databases are the embodiment of the IC module created. They may be scrutinized by debugging programs, viewed and plotted as geometry, and ultimately converted to a format for mask work generation. To plot the module and layout, the geometry data base is transformed into a format readable by the plotter. The layout of the module is then plotted layer by layer, including the port and node labels.

Figure 7:
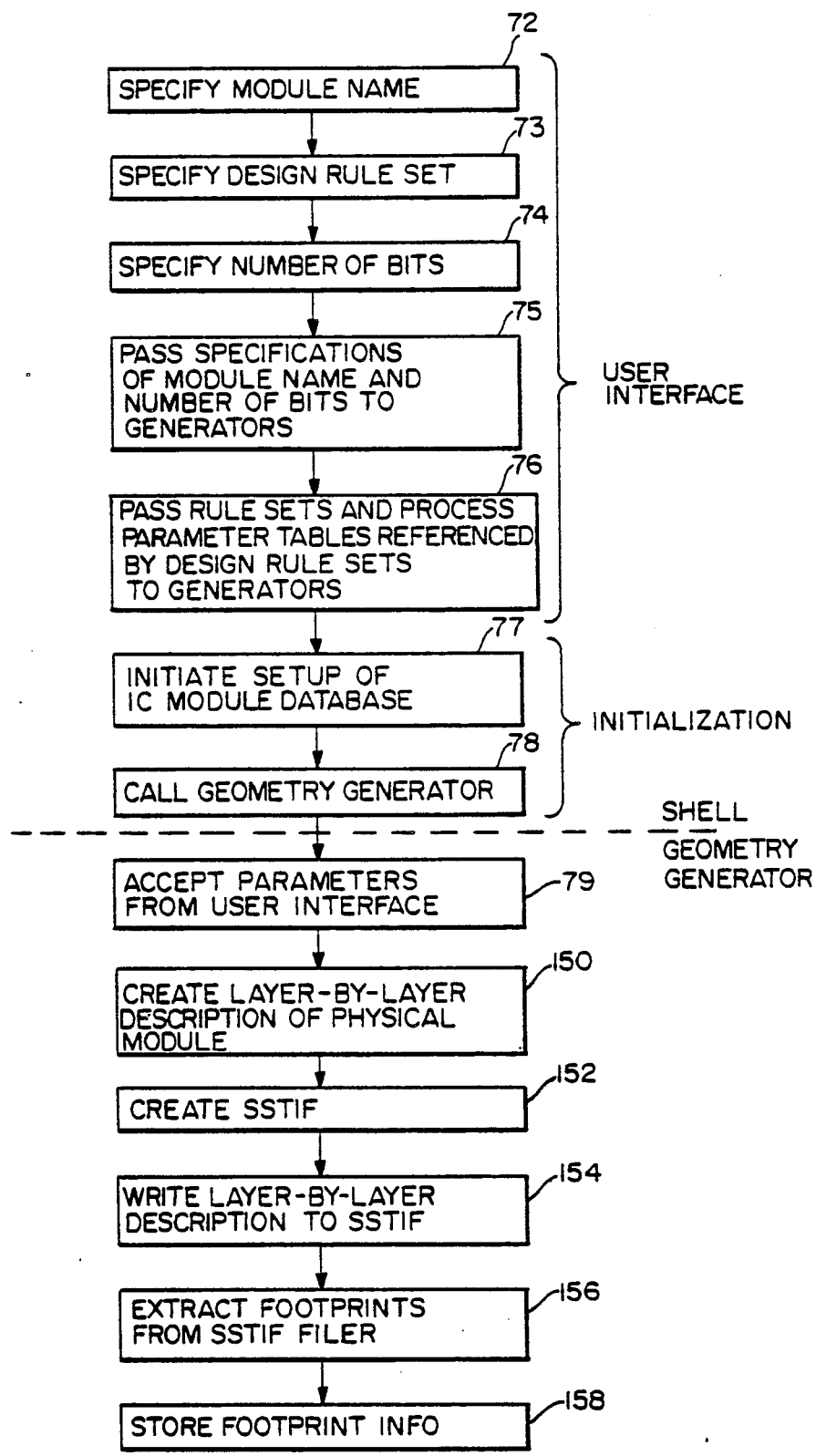
FIG. 7 is a flow chart showing the steps performed by the compiler-link editor when generating an executable module compiler for producing the integrated circuit layout geometry.

FIG. 7 is a flow chart showing the steps performed by the compiler-link editor when generating an executable module compiler for producing the integrated circuit layout geometry. The compiler consists of up to four elements: a shell, a geometry generator, a simulation model generator, and a schematic symbol generator. To produce only the integrated circuit layout geometry, the shell and geometry generator are required. The compiler shell consists of a user interface, initialization routines, and, possibly, a scanner, parser, and error handler. In the user interface of the compiler shell, it can seen that the user specifies module name (step 72), design rule set (step 73), and, where applicable, the number of bits required (step 74). In the example of a shift register, the number of bits must be specified. In step 75, the compiler shell passes the specifications of module name and number of bits to the geometry, simulation model, and schematic symbol generators. Rule set and process parameter tables referenced by the specified design rule set (step 73) are passed to the generators in step 76. Entering its initialization routines, the compiler shell then initiates the setup of the integrated circuit module database (step 77).

Figure 8:
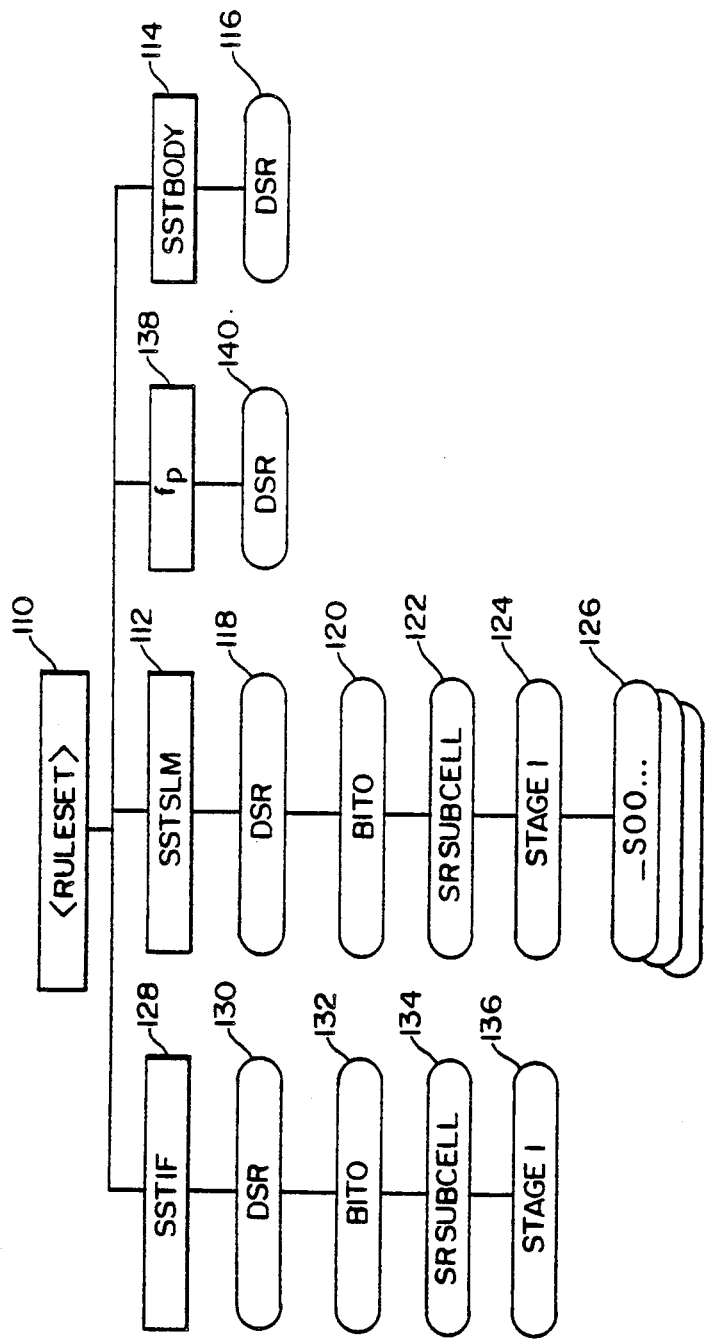
FIG. 8 is a schematic diagram showing the directory file organization for a clocked dynamic shift register of unspecified length.

FIG. 8 is a schematic diagram showing the directory file organization of the intergrated circuit module database set up in step 77 (FIG. 7). This organization is illustrated in terms of a clocked dynamic shift register of unspecified length. Directory 110 is a directory named for the design rule specified (step 73). Within this directory, the initialization routines of the shell compiler create subdirectories sstsim (112) and sstbody (114). The shell compiler then writes to directory sstsim (112) a set of simulation primitives to be used by the simulation model generator. File dsr 116 are stored under directory sstbody 114. Hierarchical files dsr 118, bit0 120, SRsubcell 122, STAGE1 124, and simulation primitive files s . . . 126 are stored under directory sstsim 112 to be used in the simulation generator.

The geometry generator accepts the parameters from the user interface and creates the layers (for example, polycrystalline silicon, metal, and active) making up the physical module. This layer-by-layer description constitutes the layout view of the integrated circuit module. This view is written to subdirectory sstif 128, which is created by the geometry generator. This directory contains the hierarchical files dsr 130, bit0 132, SRsubcell 134, and STAGE1 136. Starting at the bottom of the hierarchy, STAGE1 represents only one of the clocked stages required for a shift register subcell. File SRsubcell 134 contains the next higher description of how copies of STAGE1 (136) are connected. Likewise, bit0 (132) is described in terms of connections of SRsubcell 134, while the highest hierarchical level, file dsr (130), is described in terms of file bit0 (132).

The geometry generator also calls a utility named makefp, which reads the sstif files and extracts from them a footprint description consisting of the module's global bounding box with labeled terminal ports. These data are placed in subdirectory fp 138 in file dsr 140.

Referring back to FIG. 7, the files specified under the directories shown in FIG. 8 are created by a call to the geometry generator (step 78). Following this call, the geometry generator accepts parameters from the user interface of the compiler shell in step 79 from which the geometry generator creates a layer-by-layer description of the physical module (step 150). Directory sstif is created in step 152 and the layer-by-layer description is distributed to the files 130–136 of directory sstif 128 (154). The footprint directory is extracted from the sstif files in step 156 and stored in file fp in step 158.

Figure 9:
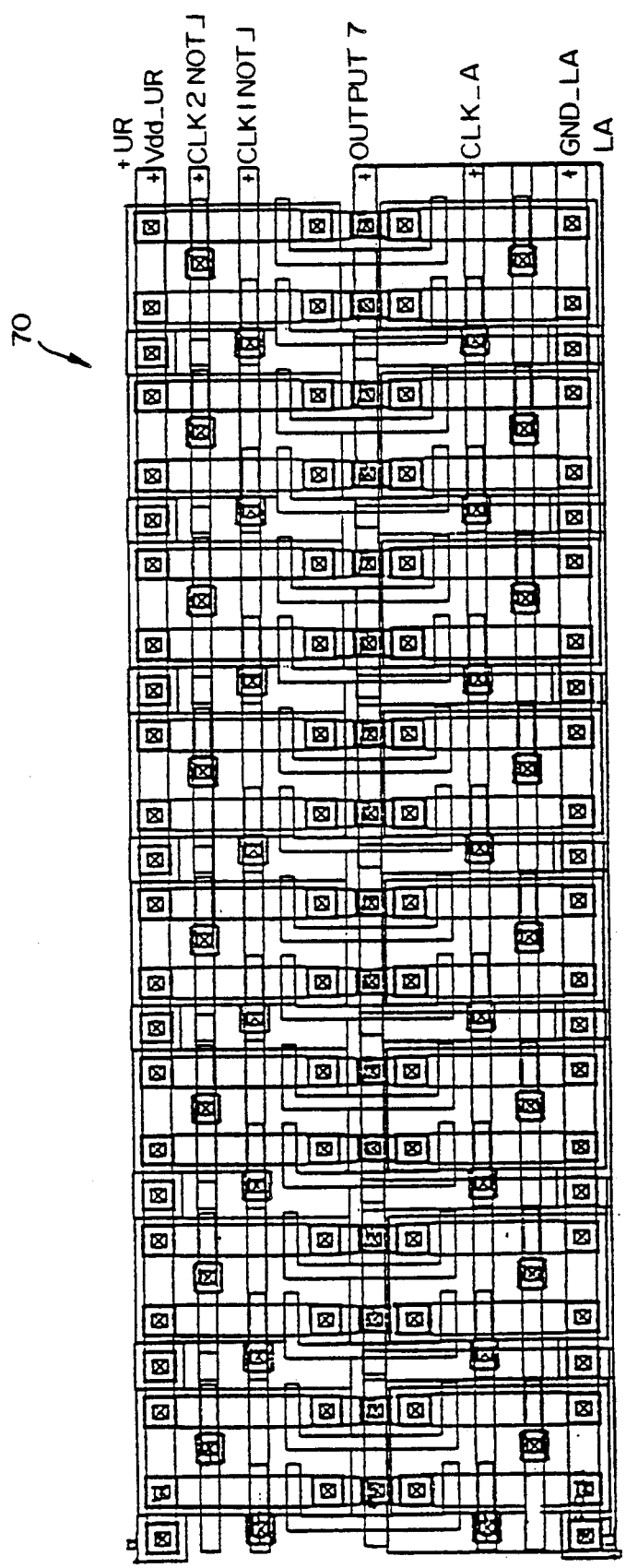
FIG. 9 is a layout of the geometry generated from the source code of Table 2.

FIG. 9 shows a black and white copy of the color plot 70 derived from the source code of Table 2.

TECHNOLOGY DESIGN RULE SPECIFICATION

At the time of compilation, the design rule variables are fixed at given values, thereby generating a specific version of the integrated circuit layout for the module under development. The design rule variables are defined in the form of a data file accessed during execution. If a version of the module is needed in a different rule set, a design rule variable file containing these new values can be substituted for the original file.

EXAMPLES

Figure 10A:
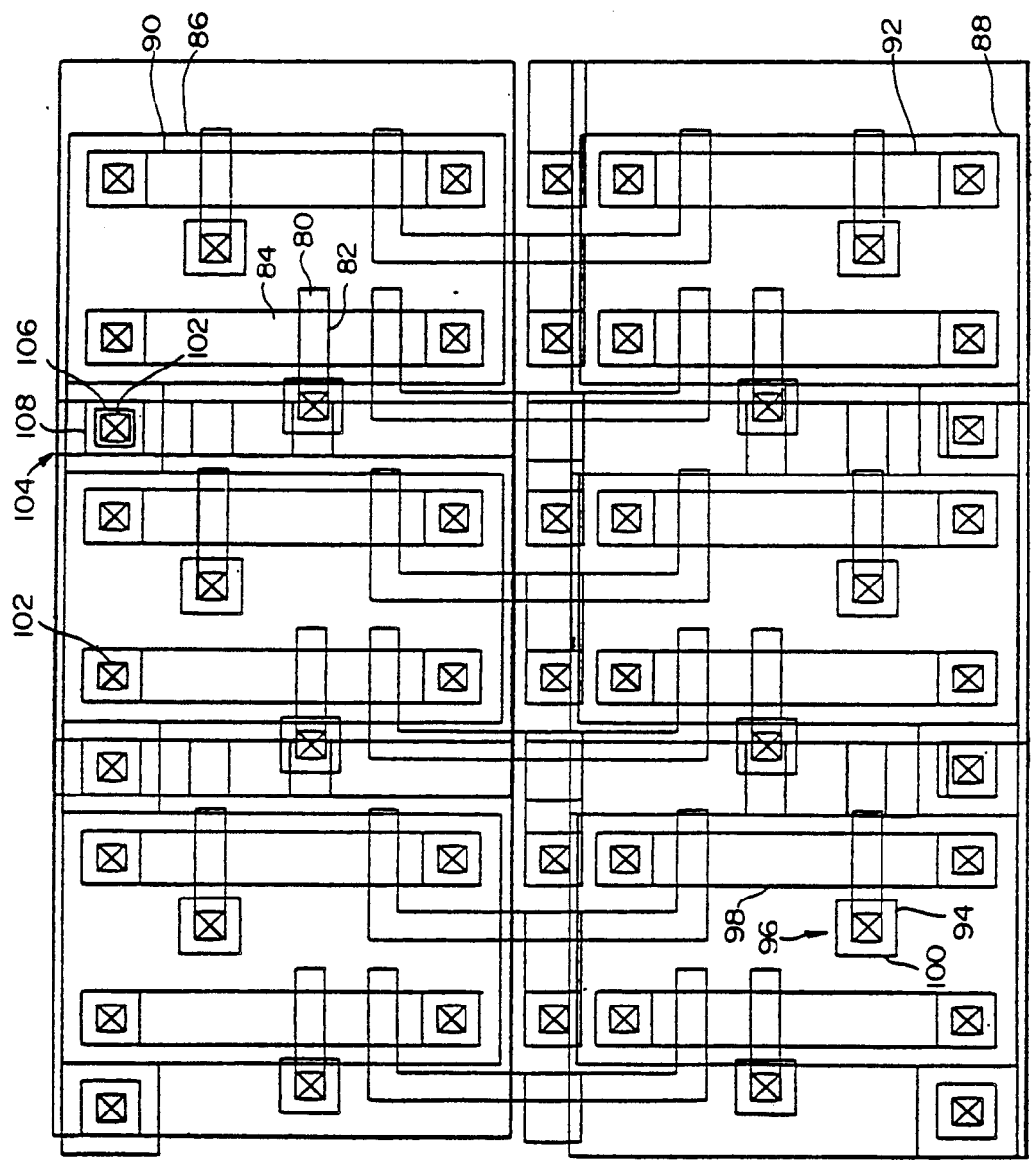
FIGS. 10A and 10B are layouts of a shift register cell, expressing the cell in two distinct technologies.
Figure 10B:
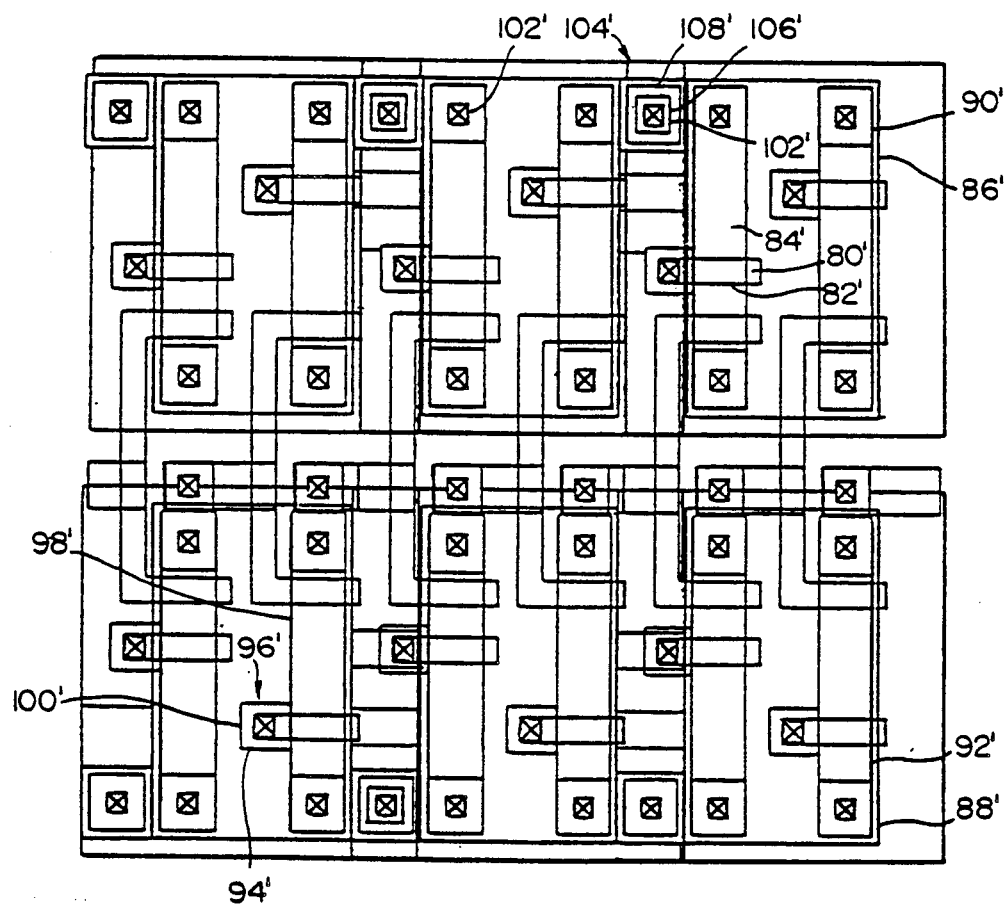

FIGS. 10A and 10B show the same shift register cell as expressed in two different technologies according to the method and apparatus of the present invention. Each cell is arranged as two rows, each row being a three-bit shift register. The techology for the shift register shown in FIG. 8A is 3-micron CMOS, having one metal and one polysilicon layer. The dimensions of the layout shown in FIG. 8A are 120.5 microns horizontally by 98 microns vertically, with a resulting aspect ratio (i.e., height/width) of 0.813. FIG. 8B is a layout of a 2-micron CMOS 3-by-2 shift register cell having two metal and one polycrystalline silicon layer. The dimensions of the bounding box of this layout are 88.06 microns horizontally and 75.42 microns vertically. This produces an aspect ratio of 0.856.

Beside the fact that there has been an obvious change of size between these two layouts, the method and apparatus of the present invention have given rise to more subtle, but operationally important, distinctions in the layout. To illustrate, because of the change in design rules between these two processes, a close comparison of overlaps 80 and 80' (FIGS. 8A and 8B, respectively) shows that the relative overlap 80 of the polysilicon crystalline trace 82 beyond active trace 84 exceeds that of overlap 80' of trace 82' beyond trace 84'.

In addition, the overlap of P+ region 86 and N+ region 88 with respect to active traces 90 and 92, respectively, exceeds the overlap of P+ region 86' and N+ region 88' beyond traces 90' and 92', respectively. As a further illustration, the design rules of the 3-micron CMOS technology shown in FIG. 8A requires the polycrystalline silicon area 94 around contact 96 to be spaced apart from active trace 98. By way of contrast, the polycrystalline silicon area 94' surrounding contact 96' is allowed to abut the active trace 98' according to the design rules of the 2-micron CMOS technology shown in FIG. 8B. In addition, where the metal layer 100 of contact 96 coincides with polycrystalline silicon area 94 in FIG. 8A, in the technology of FIG. 8B, the metal area 100' extends beyond the boundaries of area 94'.

Careful comparison of FIGS. 8A and 8B also shows that contacts designated as areas 102 and 102', respectively, are of distinctly different relative sizes. In particular, in the vicinity of contact 104, contact area 102, metal area 106, and active areas 108 have distinctly different relative sizes than do their counterparts (indicated by primed numbers) in FIG. 8B.

By means of specification of reference points in terms of design rule variables, and the subsequent specification of the numerical values defining these design rule variables, it is apparent that the present invention provides a particularly advantageous method and apparatus for the technology-independent specification of the layout of the features in an integrated circuit.

While a preferred embodiment of this invention has been described, the invention is capable of modification and addition without departing from its basic principles. Accordingly, the invention is not intended to be limited to the exact embodiment illustrated, which is presented only as an example. The scope of the invention should be determined by reference to the claims and their equivalents, interpreted in light of the prior art.

We claim:

1. A method of designing the layout of the physical geometry of an integrated circuit, the layout comprising a plurality of layers formed on a surface of a substrate, each layer including a pattern of a material having predetermined electrical properties, said method comprising:

identifying a plurality of design rule variables, each design rule variable relating to at least one geometric constraint with respect to a pattern on at least one of said layers;

defining first and second virtual coordinate axes with respect to the surface of said substrate; and defining the position of at least a portion of the pattern in at least one of said layers relative to at least one of said coordinate axes as a function of at least one of said design rule variables and the position of at least a portion of a pattern in another of said layers.

2. The method of claim 1, further including the step of defining a module specification which describes the function and technology of said integrated circuit, and wherein said step of defining the positions of at least a portion of the pattern in at least one of said layers is performed as a function of said module specification.

3. The method of claim 1, further including the step of generating a simulation model of said integrated circuit to mathematically simulate said integrated circuit, thereby allowing the performance of said integrated circuit to be verified and tested.

4. The method of claim 1, further including the step of plotting the layout of said integrated circuit after the positions of said patterns have been defined.

5. The method of claim 1 wherein said first and second virtual coordinate axes have an origin and a predetermined relationship to the surface of said substrate, and wherein said step of defining the position of at least a portion of the pattern in at least one of said layers includes the steps of:

defining landmark points among said pattern by expressing the coordinates of said pattern in terms of reference points along said first and second virtual coordinate axes, the definition of at least one reference point on said layer being given relative to said origin as a function of a reference point on another of said layers and a set of said design rule variables; and substituting respective values for said design rule variables into the definitions of said reference points.

6. A method of designing the layout of the physical geometry of an integrated circuit, the layout comprising a plurality of layers formed on a surface of a substrate, each layer including a pattern of a material having predetermined electrical properties, the pattern of materials interacting to form elemental electrical circuit features, such as transistors, contacts, and signal traces, which interfit with each other, at least one elemental electrical circuit feature being subject to at least one geometric constraint relative to another elemental electrical feature, the method comprising the steps of:

identifying a plurality of design rule variables, each design rule variable relating to at least one of said geometric constraints;

defining first and second virtual coordinate axes with respect to the surface of said substrate; and defining the positions of at least a portion of some of said elemental electrical circuit features in at least one of said integrated circuit layers relative to at least one of said coordinate axes as a function of at least one of said design rule variables and the position of at least one portion of another of said elemental electrical circuit features on the same integrated circuit layer.

7. The method of claim 6, further including the step of defining a module specification which describes the function and technology of said integrated circuit, and wherein said step of defining the positions of at least some of said elemental electrical circuit features is performed as a function of said module specification.

8. The method of claim 6, further including the step of generating a simulation model of said integrated circuit to mathematically simulate said integrated circuit, thereby allowing the performance of said integrated circuit to be verified and tested.

9. The method of claim 6, further including the step of plotting the layout of said integrated circuit after the positions of said elemental electrical circuit features have been defined.

10. The method of claim 6 wherein said first and second virtual coordinate axes have an origin and a predetermined relationship to the surface of said substrate, and wherein said step of defining the position of at least some of said elemental electrical circuit features in at least one of said layers includes the steps of:
  defining landmark points among said elemental electrical circuit features by expressing the coordinates of said circuit features in terms of reference points along said first and second virtual coordinate axes, the definition of at least one reference point on said layer being given relative to said origin as a function of a reference point on another of said layers and a set of said design rule variables; and
  substituting respective values for said design rule variables into the definitions of said reference points.

11. An apparatus for designing the layout of the physical geometry of an integrated circuit, the layout comprising a plurality of layers formed on a surface of a substrate, each layer including a pattern of a material having predetermined electrical properties, said apparatus comprising:
  input means for accepting a plurality of values corresponding to respective design rule variables, each design rule variable relating to at least one geometric constraint with respect to at least one of said layers;
  means for defining first and second virtual coordinate axes with respect to the surface of said substrate; and
  memory means for storing said plurality of values and said first and second virtual coordinate axes; and
  processing means for defining the position of at least a portion of the pattern in at least one of said layers relative to at least one of said coordinate axes as a function of at least one of said design rule variables and the position of at least a portion of a pattern in another of said layers.

12. The apparatus of claim 11, further including a simulation model generator for generating a mathematical model of said integrated circuit to simulate said integrated circuit, thereby allowing the performance of said integrated circuit to be verified and tested.

13. The apparatus of claim 11, further including means operatively connected to said processing means for plotting the layout of said integrated circuit after the positions of said patterns have been defined.

14. An apparatus for designing the layout of the physical geometry of an integrated circuit, the layout comprising a plurality of layers formed on a surface of a substrate, each layer including a pattern of a material having predetermined electrical properties, the patterns of materials interacting to form elemental electrical circuit features such as transistors, contacts, and signal traces, which interfit with each other, at least one elemental electrical circuit feature being subject to at least one geometric constraint relative to another elemental electrical feature, said apparatus comprising:
  input means for accepting a plurality of values corresponding to respective design rule variables,, each design rule variable relating to at least one of said geometric constraints;
  means for defining first and second virtual coordinate axes with respect to the surface of said substrate;
  memory means for storing said plurality of values and said first and second virtual coordinate axes; and
  processing means for defining the positions of at least a portion of some of said elemental electrical circuit features in at least one of said integrated circuit layers relative to at least one of said coordinate axes as a function of at least one of said design rule variables and the position of at least one portion of another of said elemental electrical circuit features on the same integrated circuit layer.

15. The apparatus of claim 14, further including a simulation model generator for generating a mathematical model of said integrated circuit to simulate said integrated circuit, thereby allowing the performance of said integrated circuit to be verified and tested.

16. The apparatus of claim 14, further including means operatively connected to said processing means for plotting the layout of said integrated circuit after the positions of said elemental electrical circuit features have been defined.

* * * * *